(12) United States Patent
Sung et al.

(10) Patent No.: US 9,837,404 B2
(45) Date of Patent: Dec. 5, 2017

(54) METHODS, APPARATUS AND SYSTEM FOR STI RECESS CONTROL FOR HIGHLY SCALED FINFET DEVICES

(71) Applicant: GLOBALFOUNDRIES INC., Grand Cayman (KY)

(72) Inventors: Min Gyu Sung, Latham, NY (US);
Chanro Park, Clifton Park, NY (US);
Hoon Kim, Clifton Park, NY (US);
Ruilong Xie, Niskayuna, NY (US);
Kwan-Yong Lim, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/082,242

(22) Filed: Mar. 28, 2016

(65) Prior Publication Data

US 2017/0278844 A1    Sep. 28, 2017

(51) Int. Cl.

| H01L 21/336 | (2006.01) |
|---|---|
| H01L 29/66 | (2006.01) |
| H01L 29/78 | (2006.01) |
| H01L 21/308 | (2006.01) |
| H01L 21/8234 | (2006.01) |
| H01L 27/088 | (2006.01) |
| H01L 21/3105 | (2006.01) |
| H01L 21/311 | (2006.01) |

(52) U.S. Cl.
CPC .... *H01L 27/0886* (2013.01); *H01L 21/31053* (2013.01); *H01L 21/31116* (2013.01); *H01L 21/31144* (2013.01); *H01L 21/823431* (2013.01); *H01L 21/823481* (2013.01)

(58) Field of Classification Search
CPC ....... H01L 21/76; H01L 27/088; H01L 27/12; H01L 29/06; H01L 29/78; H01L 29/94
USPC .... 257/288, 295, 324, 283; 438/3, 296, 424, 438/427
See application file for complete search history.

(56) References Cited

U.S. PATENT DOCUMENTS

| 2013/0045580 A1* | 2/2013 | Cho ................ H01L 21/823431 438/296 |
| 2013/0056826 A1* | 3/2013 | Liu ................. H01L 21/823431 257/347 |
| 2013/0328162 A1* | 12/2013 | Hu ...................... H01L 27/0629 257/526 |

* cited by examiner

*Primary Examiner* — Kimberly Rizkallah
*Assistant Examiner* — Brian Turner
(74) *Attorney, Agent, or Firm* — Williams Morgan, P.C.

(57) ABSTRACT

At least one method, apparatus and system are disclosed for forming a fin field effect transistor (finFET) having an oxide level in a fin array region within a predetermined height of the oxide level of a field region. A first oxide process is performed for controlling a first oxide recess level in a field region adjacent to a fin array region comprising a plurality of fins in a finFET device. The first oxide process comprises depositing an oxide layer over the field region and the fin array region and performing an oxide recess process to bring the oxide layer to the first oxide recess level in the field region. A second oxide process is performed for controlling a second oxide recess level in the fin array region. The second oxide process comprises isolating the fin array region, depositing oxide material, and performing an oxide recess process to bring the oxide level in the fin array region to the second oxide recess level. The first oxide recess level is within a predetermined height differential of the second oxide recess level.

15 Claims, 14 Drawing Sheets

METHODS, APPARATUS AND SYSTEM FOR STI RECESS CONTROL FOR HIGHLY SCALED FINFET DEVICES

BACKGROUND OF THE INVENTION

Field of the Invention

Generally, the present disclosure relates to the manufacture of sophisticated semiconductor devices, and, more specifically, to various methods for STI recess control for highly scaled fin pitch for finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be position to a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

Designers are increasingly attempting to scale down integrated circuits to support smaller electronic devices. One manner of reducing scaling down integrated circuits is to produce smaller transistors. As such, designers are attempting to reduce the size of finFET devices by reducing the pitch of fins in finFET devices. One problem associated with reducing the fin pitch is that it is increasingly difficult to reduce the recess height of oxide in the area of the fin array to approximately conform to the recess height of the area without fins.

FIG. 2 illustrates a stylized depiction of a typical integrated circuit having a finFET array that has a recess height that is higher than the recess height in open area of the integrated circuit. FIG. 2 shows an integrated circuit device portion 200 that comprises a set of fins 210 formed within an insulation material (e.g., silicon oxide). The fins 210 are formed over a substrate 205 in a fin area 220. A hard mask layer 212 is formed over the fins 210. An oxide liner 214 and a nitride liner 216 (e.g., SiN) is formed around the fins 210. The device portion 200 also includes a field area 240 over the substrate 205.

The device portion 200 comprises a layer of oxide material 230 (e.g., $SiO_2$) that encompasses the fin area 220 and field area 240. An oxide recess process is subsequently performed. The oxide recess process is performed to cause the oxide layer 230 to recess back to a predetermined level. Typically, this oxide recess process is performed using a dry etching process. In many cases, a pattern loading effect takes place during these processes. The pattern loading effect refers to a recess rate becoming slow for the dense area of the fin area 230. The smaller the fin pitch, the more sever the pattern loading effect. Therefore, when smaller integrated circuits are manufactured, prompting smaller fin pitch in finFET devices, pattern loading effect often cause a non-uniform oxide recess rate between fin areas 230 and field areas 240. Therefore, after the oxide recess process, the result may be a non-uniform oxide level, e.g., the oxide level in the fin area 235 being higher than the oxide level in the field area 240 by a height difference of H1. The height H1 represents recess loading between the fin areas 230 and the field areas 240. In many cases, the height H1 is greater than about 10 nm.

The height difference (H1) between the oxide level in the fin area 230 and the oxide level in the field area 240 may be problematic during processing of semiconductor wafers. For example, this height difference, H1, may cause NFET/PFET fin height (Hfin) variation in completed devices, e.g., SRAM devices, causing device performance problems. Further, this height difference, H1, may cause fin height variations that may cause process errors. Further, in shallow trench isolations (STI) regions, the gate height of the gate being processed may be impacted, resulting in gate-height being lower. These detrimental effects caused by the height difference in the oxide level in the fin area 230 and the field area 240, may cause various process and manufacturing errors.

Some designers have attempted to alleviate the problem of an appreciable height difference in the oxide level in the fin area 230 and the field area 240 by performing an additional lithography process. However, this additional lithography process can be costly and time consuming.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a fin field effect transistor (finFET) having an oxide level in a fin array region within a predetermined height of the oxide level of a field region. A first oxide process is performed for controlling a first oxide recess level in a field region adjacent to a fin array region comprising a plurality of fins in a finFET device. The first oxide process comprises depositing an oxide layer over the field region and the fin array region and performing an oxide recess process to bring the oxide layer to the first oxide recess level in the field region. A second oxide process is performed for controlling a second oxide recess level in the fin array region. The second oxide process comprises isolating the fin array region, depositing oxide material, and performing an oxide recess process to bring the oxide level in the fin array region to the second oxide recess level. The first oxide recess level is within a predetermined height differential of the second oxide recess level.

BRIEF DESCRIPTION OF THE DRAWINGS

The disclosure may be understood by reference to the following description taken in conjunction with the accompanying drawings, in which like reference numerals identify like elements, and in which.

Figure 1:
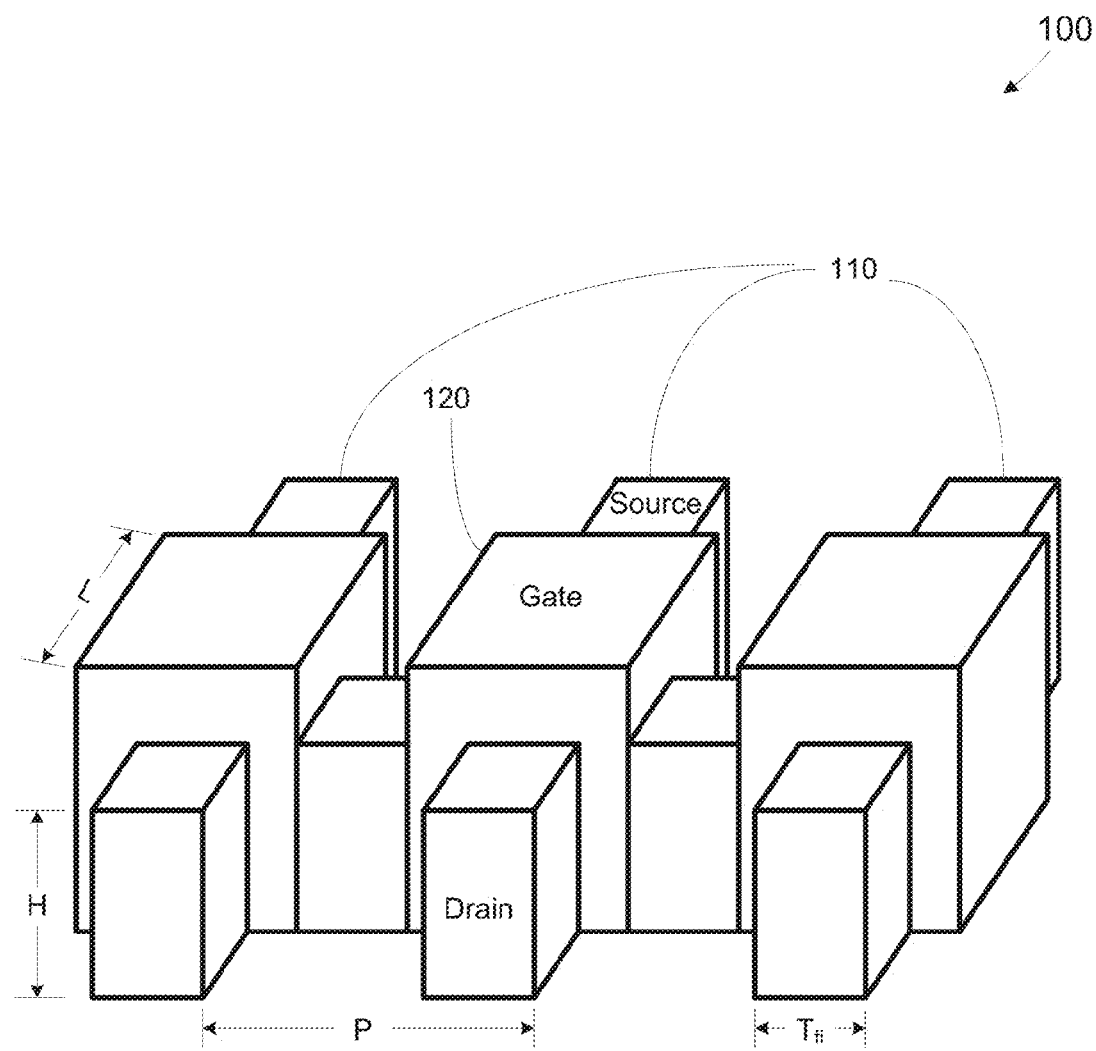
FIG. 1 illustrates a stylized cross-sectional depiction of a state-of-the-art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figs. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for performing independent recess control on a fin area and an area that does not comprise fins (i.e., field area), such as an STI area. Embodiments provide for controlling processing operations such that oxide recess level in a fin array area is within a predetermined height difference as compared to the oxide recess level in a non-fin area (i.e., field area or STI area).

Embodiments herein provide for performing independent recess control of oxide recess to ensure that the level of the oxide recess of a fin array area is within an acceptable height margin compared to the level of the oxide recess in a field or non-fin area without required additional processing, such an additional lithography step.

Figure 3:
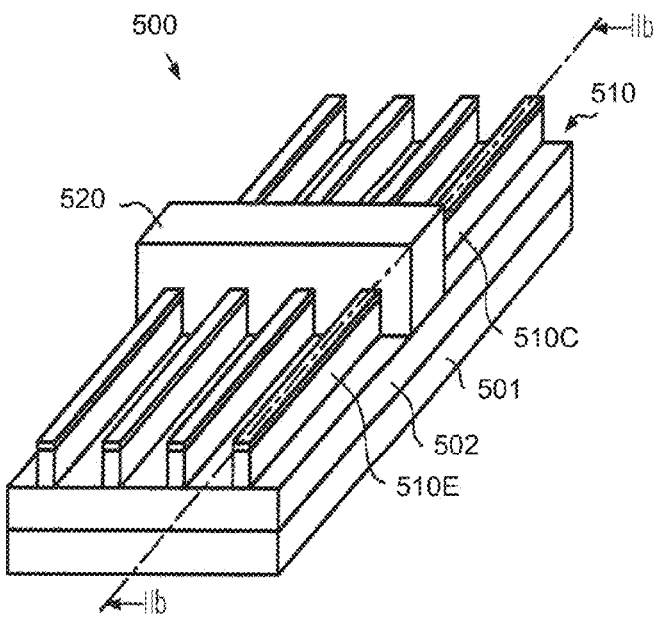
FIG. 3 illustrates a first stylized diagram relating to performing an initial process of forming a finFET device.
Figure 4:
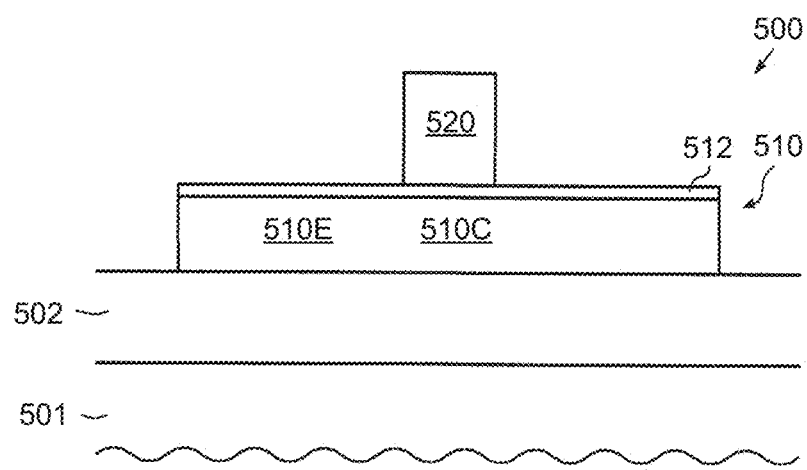
FIG. 4 illustrates a second stylized diagram relating to performing an initial process of forming a finFET device.
Figure 5:
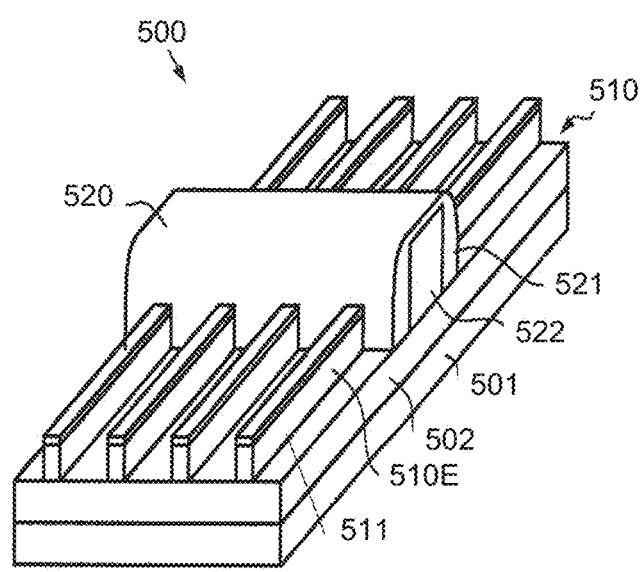
FIG. 5 illustrates a third stylized diagram relating to performing an initial process of forming a finFET device.

FIGS. 3-5 illustrate various stylized diagrams relating to performing an initial process of forming a finFET device, in accordance with embodiments herein. FIG. 3 schematically illustrates a perspective view of a semiconductor device 500, which may be a finFET device comprising a plurality of fins. In the manufacturing stage shown, the device 500 may comprise a substrate 501, such as a silicon substrate or any other appropriate carrier material, on which may be formed an appropriate base layer 502, which, in some illustrative embodiments, may represent an insulating layer, such as a silicon dioxide layer, a silicon nitride layer, a silicon oxynitride layer and the like. For example, if the substrate 501 may be comprised of a substantially crystalline semiconductor material, the base layer 502, if provided in the form of an insulating material, and the substrate 501 may define a silicon on insulator (SOI) configuration.

Moreover, a plurality of fins 510 are formed on the layer 502 and comprise respective end portions 510E and a central portion 510C, which is covered by a gate electrode structure 520. Furthermore, a gate insulation material may be formed at least on sidewalls of the fins 510 (not shown in FIG. 3) while a corresponding gate insulation layer may be formed on a top surface of the fins 510 if a tri-gate transistor architecture is considered. In other cases, the fins 510 may be covered by a cap layer (not shown) which may result in an insufficient capacitive coupling to the fins 510, so that the top surface thereof may effectively not act as a channel region. With respect to any material composition of the fins 510, it is to be appreciated that any appropriate material, such as silicon, silicon/germanium, germanium or any other appropriate semiconductor compound may be used, depending on the overall device requirements. Similarly, the corresponding dimensions of the fins 510 may be selected in accordance with the design rules of the corresponding technology node under consideration.

FIG. 4 illustrates a stylized depiction of a cross-sectional view taken along the section IIb of FIG. 3. As illustrated, a cap layer 512, such as a silicon oxide layer or a high-K HFO2 layer, and/or the like, may be formed on the fins 510, and the gate electrode structure 520. The gate electrode structure 520 may be comprised of any appropriate material, such as polysilicon, a metal-containing material and the like, may be formed on the cap layer 512 and may also extend down to the layer 502 along the corresponding sidewalls of a Fin 510 (not shown in the section of FIG. 4). The semiconductor device 500 as shown in FIGS. 3 and 4 may be formed on the basis of well-established process techniques as are, for instance, also explained above with reference to the device 500.

FIG. 5 illustrates a stylized depiction of a perspective view of the transistor 500 in a further advanced manufacturing stage. As illustrated, the gate electrode structure 520 may comprise a sidewall spacer structure 521, which may be comprised of any appropriate material such as silicon nitride, silicon dioxide and the like. The spacer structure may be formed on the basis of well-established deposition and etch techniques, wherein a width of the spacer structure 520 may be selected in accordance with a desired dopant profile in each of the end portions 510E of the Fins 510. That is, moderately high dopant concentration may be established in the end portions 510E adjacent to the gate electrode structure 520, possibly by using an offset spacer element (not shown) and thereafter one or more spacer elements of the structure 521 may be provided and may be used as an implantation mask during one or more subsequent implantation steps to provide the desired high dopant concentration in the end portions 510E with a lateral distance to a gate electrode material 522 of the gate electrode structure 520. It should be appreciated that any appropriate concentration profile extending from the electrode material 522 may be established by appropriately forming a corresponding number of spacer elements in the structure 521. It should further be appreciated that any other implantation processes may be performed, for instance with respect to defining a counter doped area in the vicinity of the central portion 510C, which represents the actual channel region. Drain and source regions 511 may be formed at oppositely positioned end portions 510E having the desired dopant concentration and concentration gradient with respect to the central portion 510C.

Figure 6A:
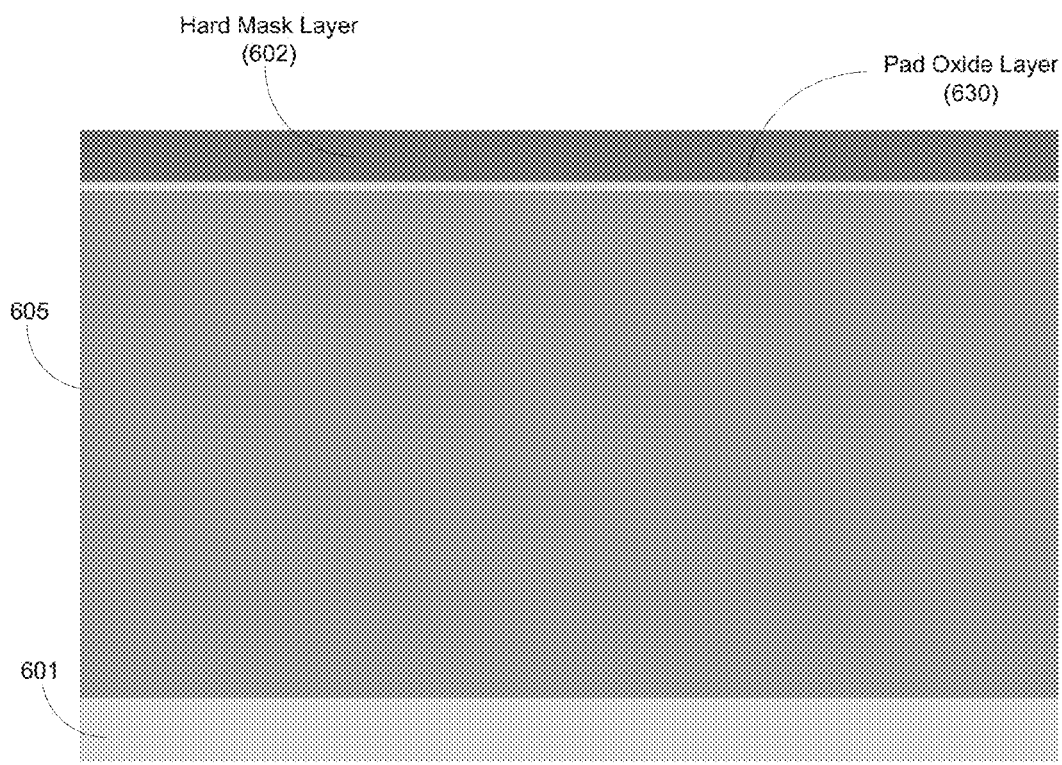
FIG. 6A illustrates a first stylized diagram relating to forming a plurality of fins on a finFET device, in accordance with embodiments herein.

FIGS. 6A-6F illustrate various stylized diagrams relating to forming a plurality of fins of a finFET device, in accordance with a first embodiment of the present disclosure. As shown in FIG. 6A, a substrate 601, such as a silicon substrate or any other appropriate carrier material, may be prepared for processing. On the substrate 601, an appropriate base layer 605, which, in some illustrative embodiments may represent an insulating layer, such as a silicon dioxide layer, a silicon nitride layer, a silicon oxynitride layer, and/or the like, may be formed. For example, if the substrate 601 may be comprised of a substantially crystalline semiconductor material, the base layer 605, is provided in the form of an insulating material, and the substrate 601 may define a silicon on insulator (SOI) configuration.

A thin layer 630 of oxide material (e.g., $SiO_2$) may be formed on the top of the base layer 605. Subsequently, a hard mask layer 620 may be formed on top of the thin oxide layer 630. In one embodiment, the hard mask layer 620 may be comprised of silicon nitride (SiN, e.g., $Si_3N_4$).

Figure 6B:
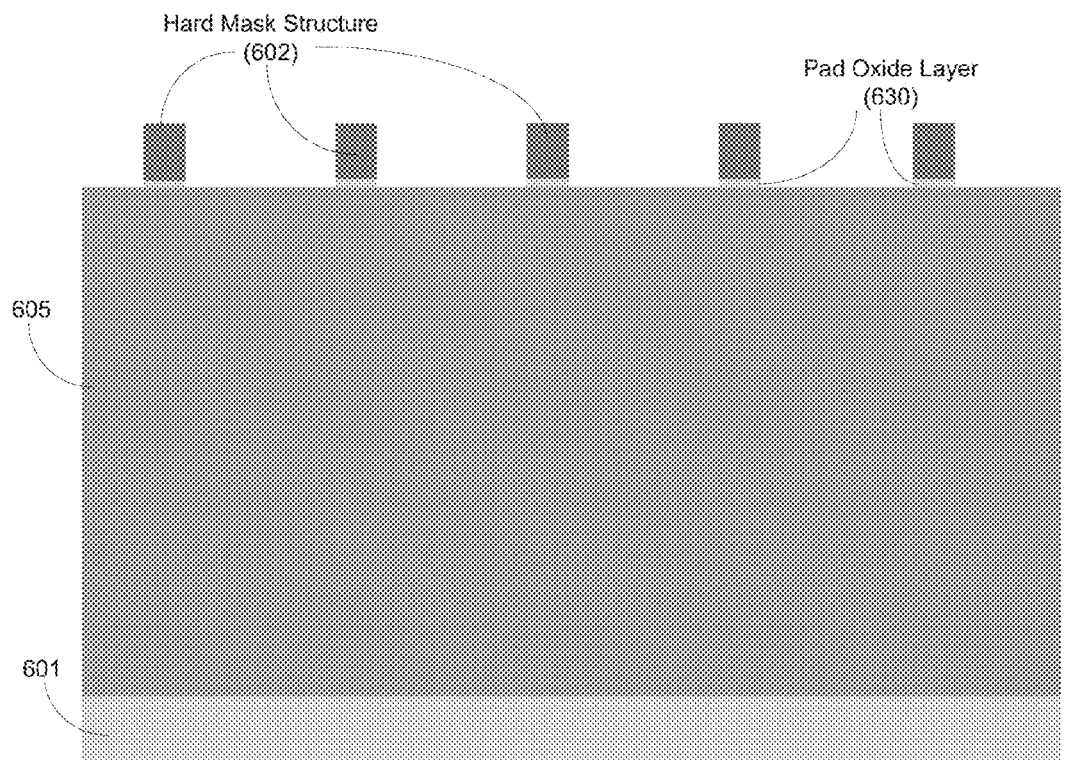
FIG. 6B illustrates a second stylized diagram relating to forming a plurality of fins on a finFET device, in accordance with embodiments herein.

A hard mask/oxide layer patterning may be performed. This patterning process may be performed using methods known to those skilled in the art having benefit of the present disclosure. This patterning process results in a patterned set of hard mask structures 620, as shown in FIG. 6B. Each of the hard mask structures 620 has a portion of the thin oxide layer 630.

Figure 6C:
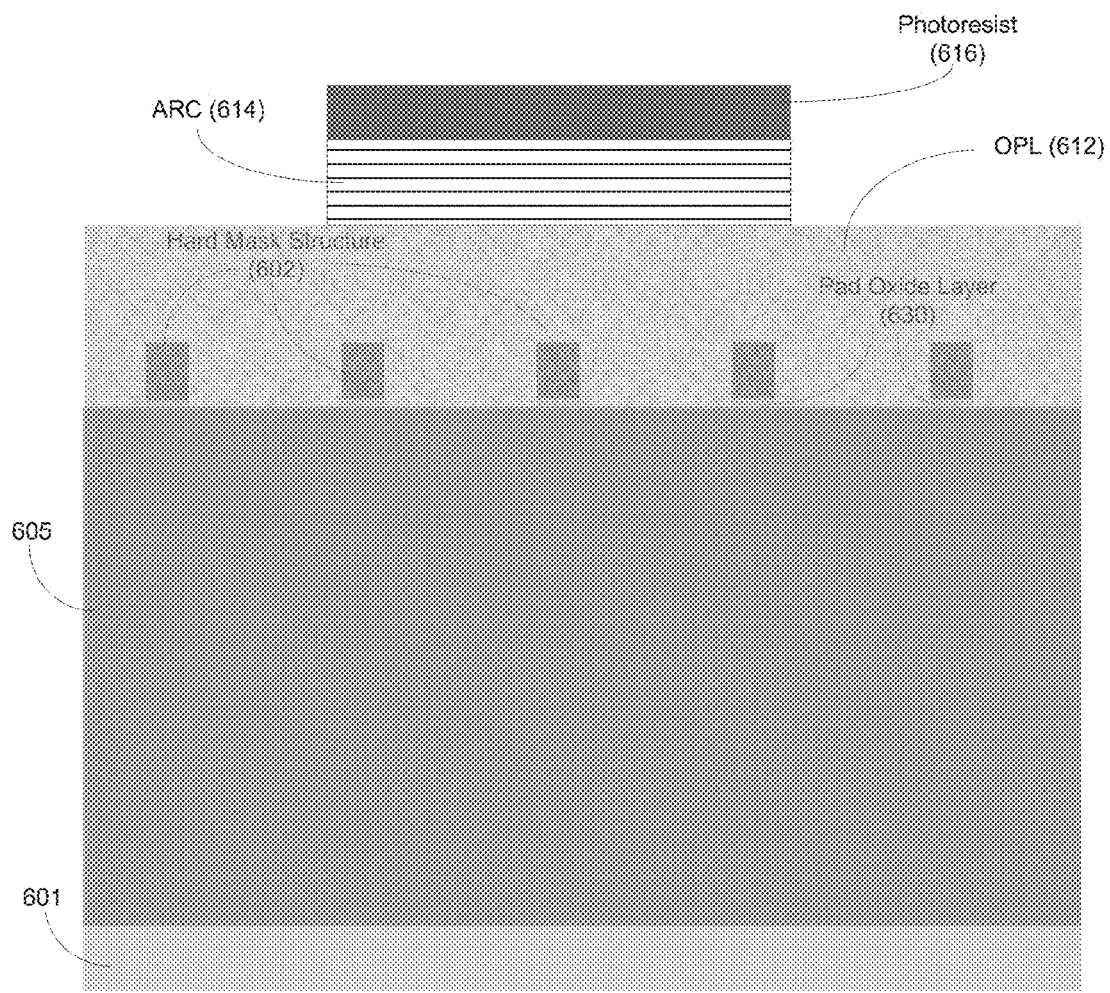
FIG. 6C illustrates a third stylized diagram relating to forming a plurality of fins on a finFET device, in accordance with embodiments herein.

Subsequently, a fin cut lithography patterning process is performed. As shown in FIG. 6C, an optical planarization layer (OPL) 612 is deposited on top of the base layer 602 and the hard mask structures 620. Further, in the location where fins are to be formed, an anti-reflecting coating (ARC) layer 614 is deposited. A photoresist layer 616 is deposited directly on the ACR layer 614.

Figure 6D:
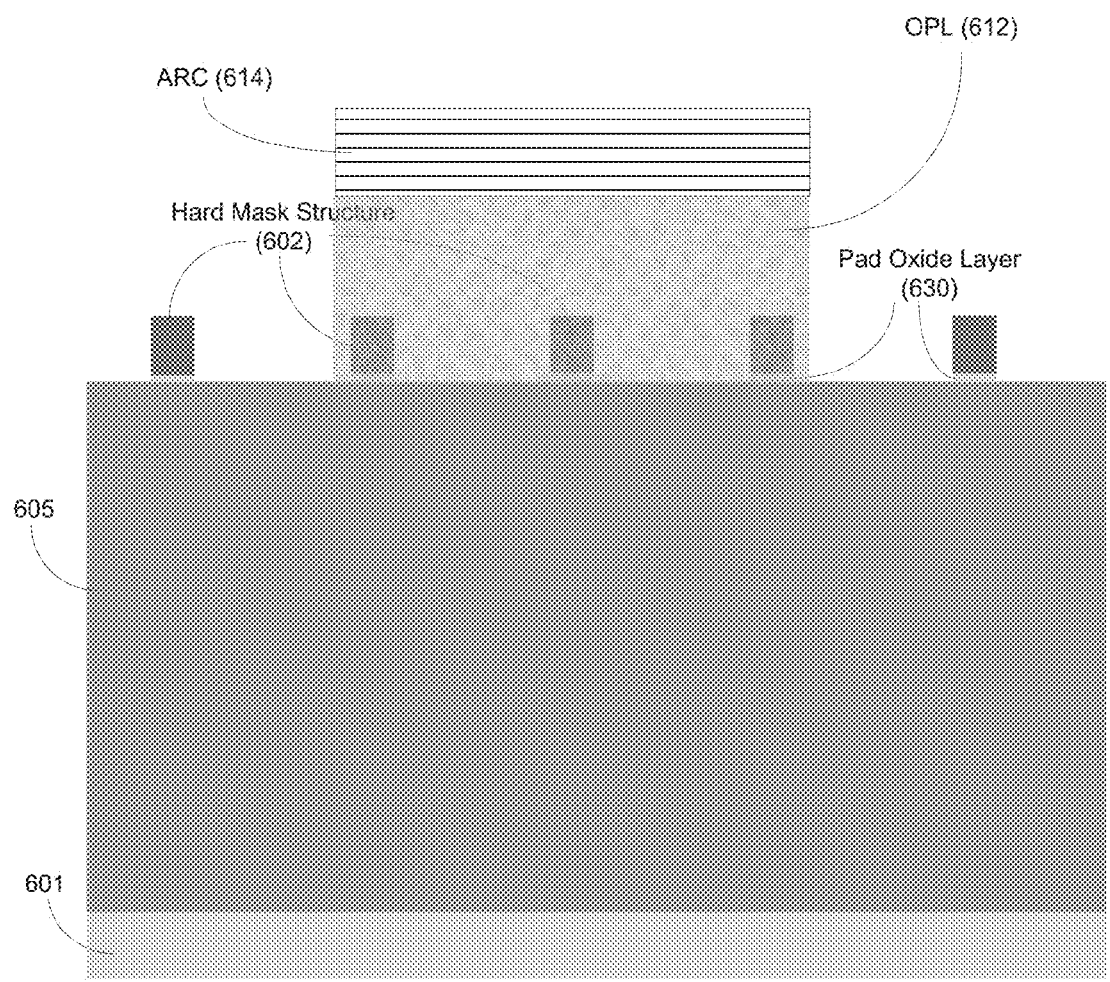
FIG. 6D illustrates a fourth stylized diagram relating to forming a plurality of fins on a finFET device, in accordance with embodiments herein.

As shown in FIG. 6D, a photolithography process is performed to eliminate the OPL 612 from areas that would not contain fins, i.e., OPL open process on fin cut area. After this process, the ARC layer 614 and the OPL 612 remain only over the area where the fins are to be formed.

Figure 6E:
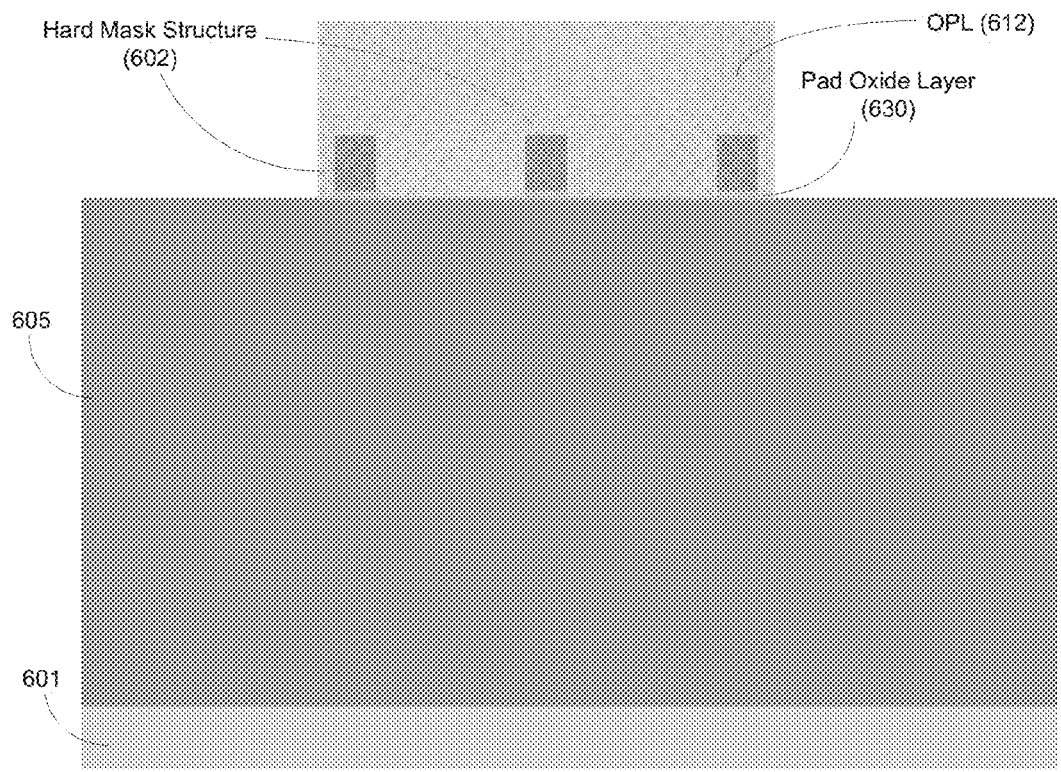
FIG. 6E illustrates a fifth stylized diagram relating to forming a plurality of fins on a finFET device, in accordance with embodiments herein.
Figure 6F:
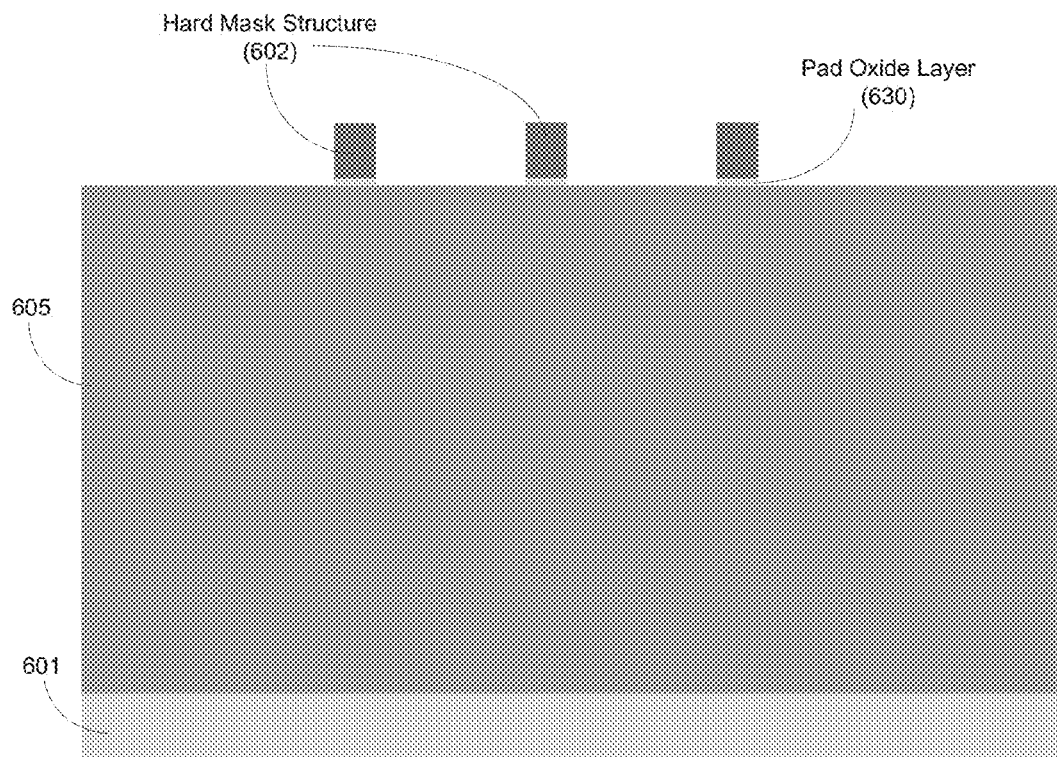
FIG. 6F illustrates a sixth stylized diagram relating to forming a plurality of fins on a finFET device, in accordance with embodiments herein.

As shown in FIG. 6E, a reactive ion etching (ME) process is performed to remove the hard mask structures 620 and the thin oxide layers 630 below the hard mask structures in areas where fins will not be formed, i.e., areas outside the OPL 612. The ARC 614 is also removed due to this process. As indicated in FIG. 6E, after the RIE process, the only remaining hard mask structures 620 are the ones under which fins are to be formed. Accordingly, an OPL removal process is performed to remove the OPL 612, as shown in FIG. 6F. This leaves hard mask structures 620 over thin oxide layers 630, under which fins will be formed.

Figure 6G:
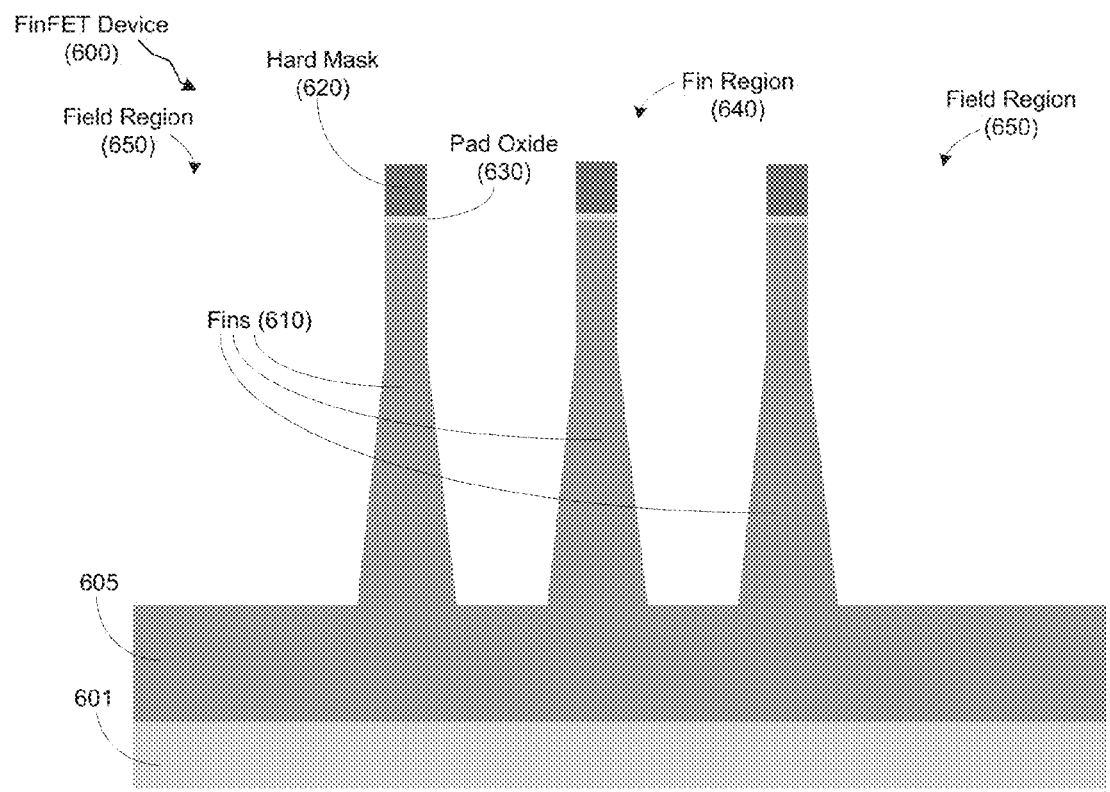
FIG. 6G illustrates a seventh stylized diagram relating to forming a plurality of fins on a finFET device, in accordance with embodiments herein.

In order to form the fins, a channel RIE process is performed to remove a portion of the base layer 605. In this process, the base layer material is removed to a predetermined depth, leaving only the fin structures 610 in areas that were protected by the hard mask structures 620, as shown in FIG. 6G. Subsequent to this process, a finFET device 600 is provided. In the manufacturing stage shown, the finFET device 600 comprises the substrate 601, the base layer 605, and a plurality of fins 610.

A plurality of fins 610 are formed on the layer 605 at a fin array region 640. For ease of illustration, only three fins are shown, however, those skilled in the art having benefit of the present disclosure would appreciate that the fin array region 640 may comprise any number of fins and remain within the spirit and scope of the embodiments herein. The device 600 also comprises a field region 650 (i.e., a non-fin region or an STI region). The fins 610 may be formed using silicon material or silicon germanium material (e.g., SiGe III-V). In some embodiments, the fins 610 may be formed such that the spacing between the fins 610 are relatively small, e.g., less than about 30 nm.

Figure 7:
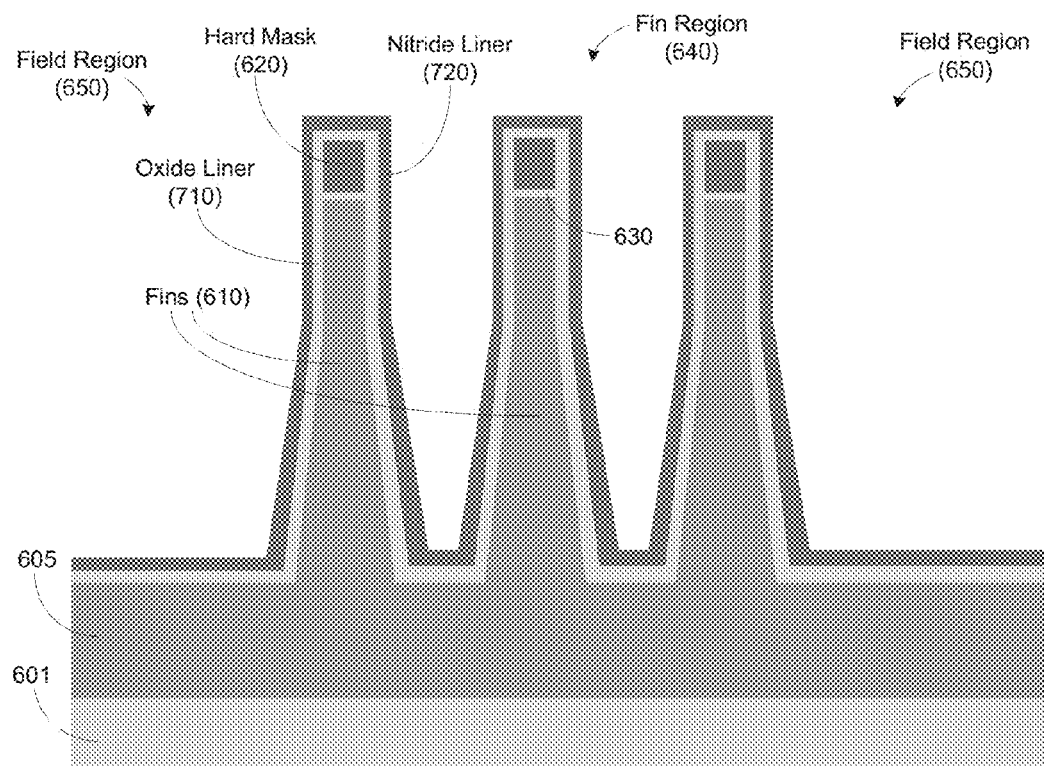
FIG. 7 illustrates a first stylized depiction of a cross-sectional view of further processing fins of a finFET device, in accordance with a embodiments herein.

FIGS. 7-17 illustrate stylized depictions of cross-sectional views of further processing fins of a finFET device 600, in accordance with embodiments of the present disclosure. The drawings provided in FIGS. 7-17 represent processes that may be performed after fin cut integration processes are performed. FIG. 7 provides a stylized depiction of liner processing steps, in accordance with embodiments herein. An oxide liner 710 (e.g., $SiO_2$) is deposited on the fins 610 and the hard mask layer 620, encompassing the entire fin structure of FIGS. 6A-6F. Subsequently, a thin nitride liner 720 (e.g., SiN) is deposited above the oxide liner 710, encompassing the entire fin structure of FIG. 7. Further, the thin nitride liner 720 is also deposited between the fins 610, above the base layer 605.

Figure 8:
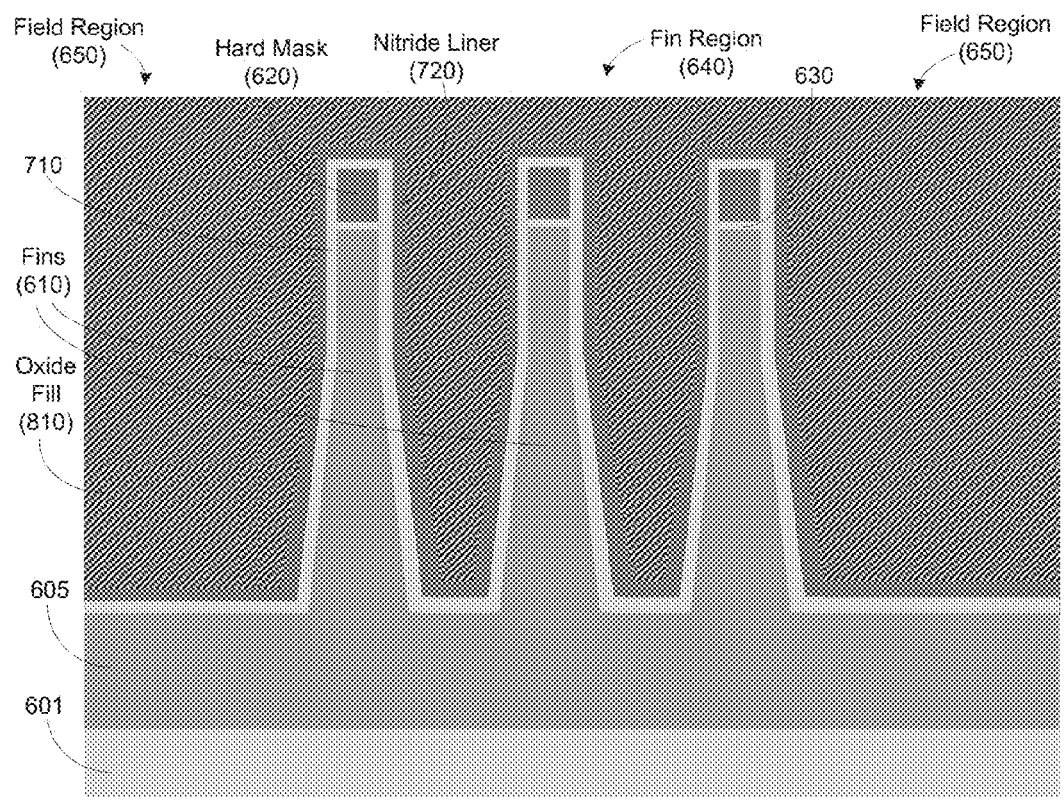
FIG. 8 illustrates a second stylized depiction of a cross-sectional view of further processing fins of a finFET device, in accordance with a embodiments herein.

As shown in FIG. 8, an oxide fill layer 810 (e.g., $SiO_2$) is deposited onto the device 600. The fill layer 810 is deposited to encompass the fin region 640 (including the fins 610), as well as the field regions 650. In one embodiment, the fill layer 810 may comprise the same material ($SiO_2$) as the oxide liner 710, separated by the nitride liner 720.

Figure 9:
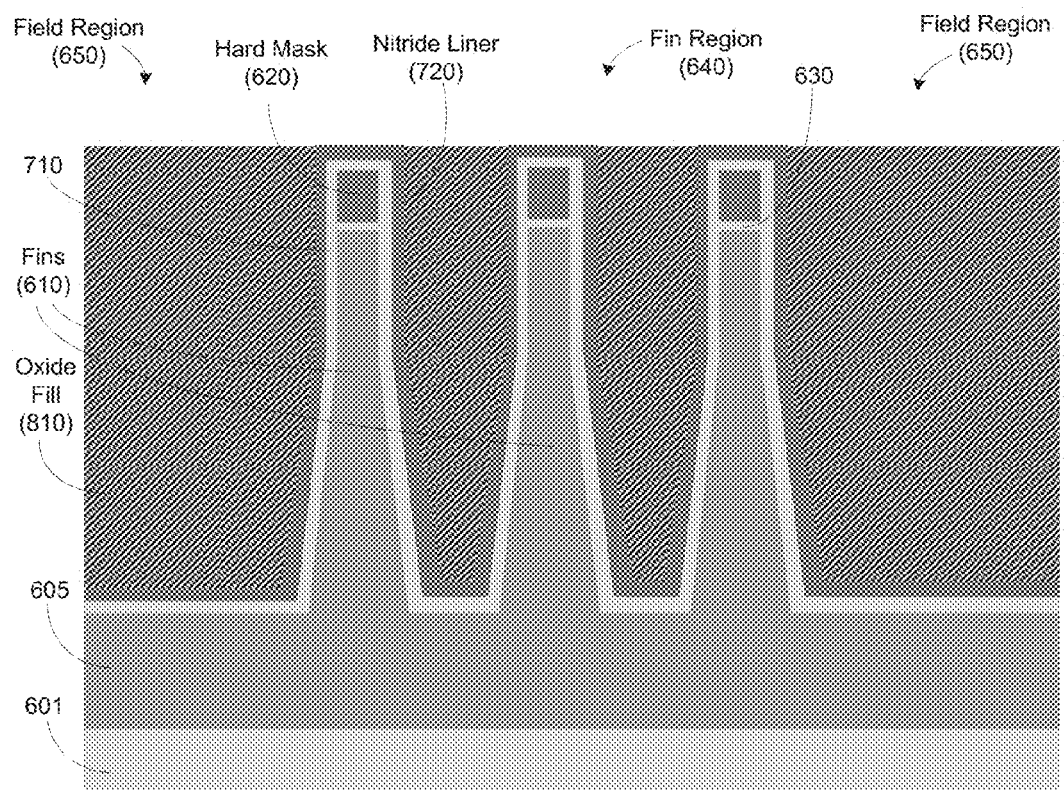
FIG. 9 illustrates a third stylized depiction of a cross-sectional view of further processing fins of a finFET device, in accordance with a embodiments herein.

Upon deposition of the oxide fill layer 810, a chemical-mechanical polishing (CMP) process may be performed, as indicated in FIG. 9. The CMP process polishes the oxide fill layer 810 to the level of the fin 610, or more particularly, the fin assembly, which comprises the fin structure, the hard mask, and the liners described above. More specifically, CMP process polishes down the fill oxide layer 810 down to the nitride liner 720 at the top of the fins.

Figure 10:
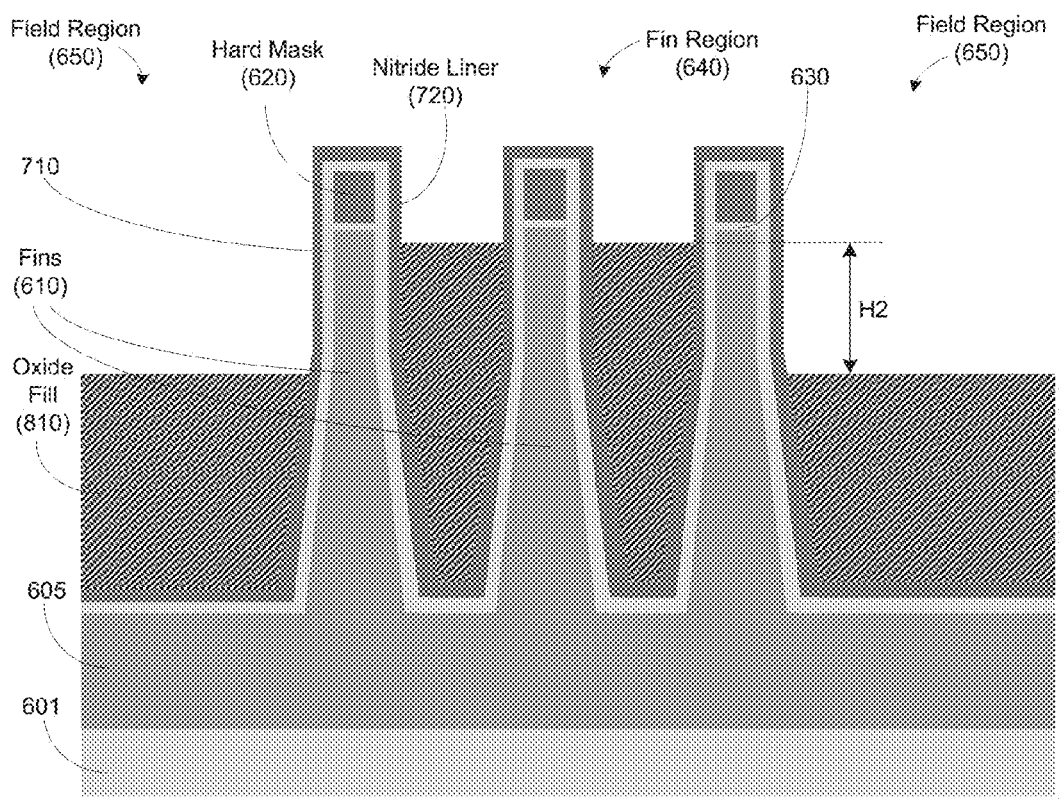
FIG. 10 illustrates a fourth stylized depiction of a cross-sectional view of further processing fins of a finFET device, in accordance with a embodiments herein.

As shown in FIG. 10, an oxide recess process is performed. This recess process causes the oxide fill layer 810 to recede. However, in the field regions 650, the recess rate may be higher, and as such, the oxide layer 810 in the field region recedes further than the oxide layer 810 in the fin region. The height differential (H2) is the result of recess loading. The height differential H2 may be representative of the active channel fin height. In some embodiments, the height H2 may be approximately 30-40 nm.

Figure 2:
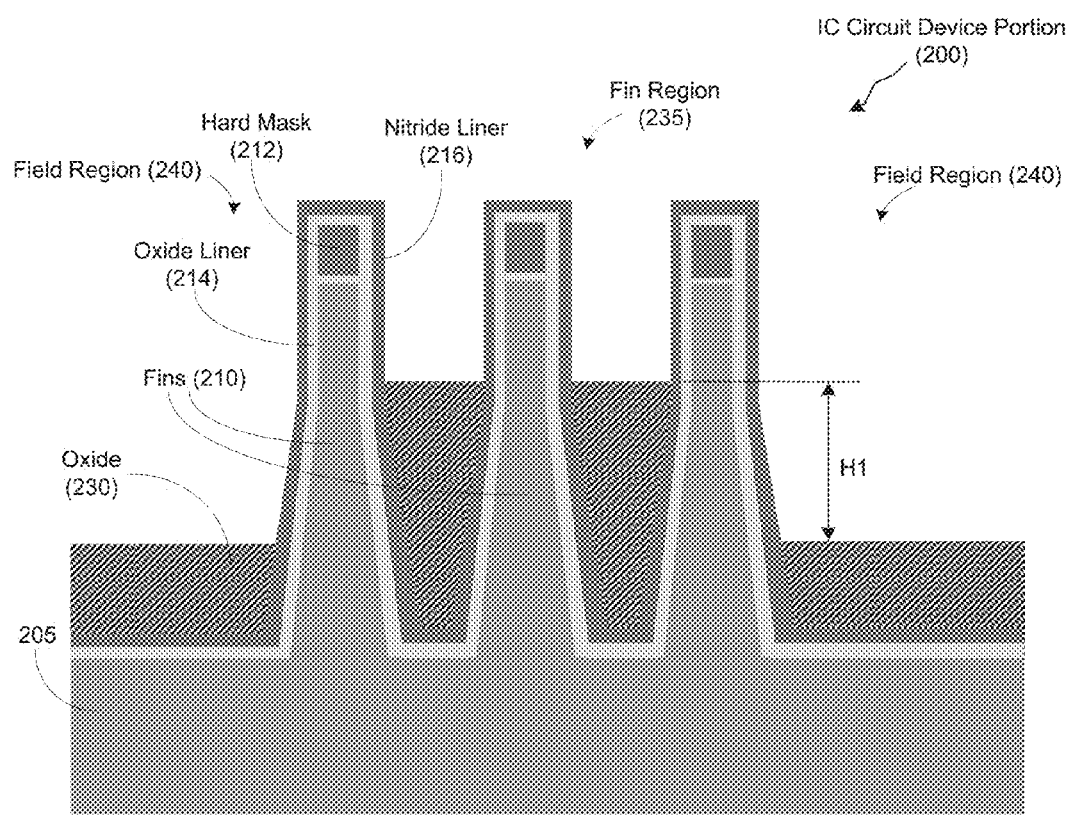
FIG. 2 illustrates a stylized depiction of a typical integrated circuit having a finFET array that has a recess height that is higher than the recess height in open area of the integrated circuit.

The difference between the prior art height difference (H1), as shown in FIG. 2, is that the recess depth in the fin region 640 of FIG. 10 is shallower than the corresponding recess depth in FIG. 2. In the embodiment of FIG. 10, the oxide recess depth in the fin region 640 is only a little below the hard mask area 620. In contrast, the recess depth in prior art processes (FIG. 2) is much deeper. Thus, in FIG. 10, the fins 610 are less defined at this stage of the process, as compared to FIG. 2 since in FIG. 10, the oxide layer 810 is only recessed back to about the height of the fins 610, just below the height at the beginning of the hard mask layer 620.

Figure 11:
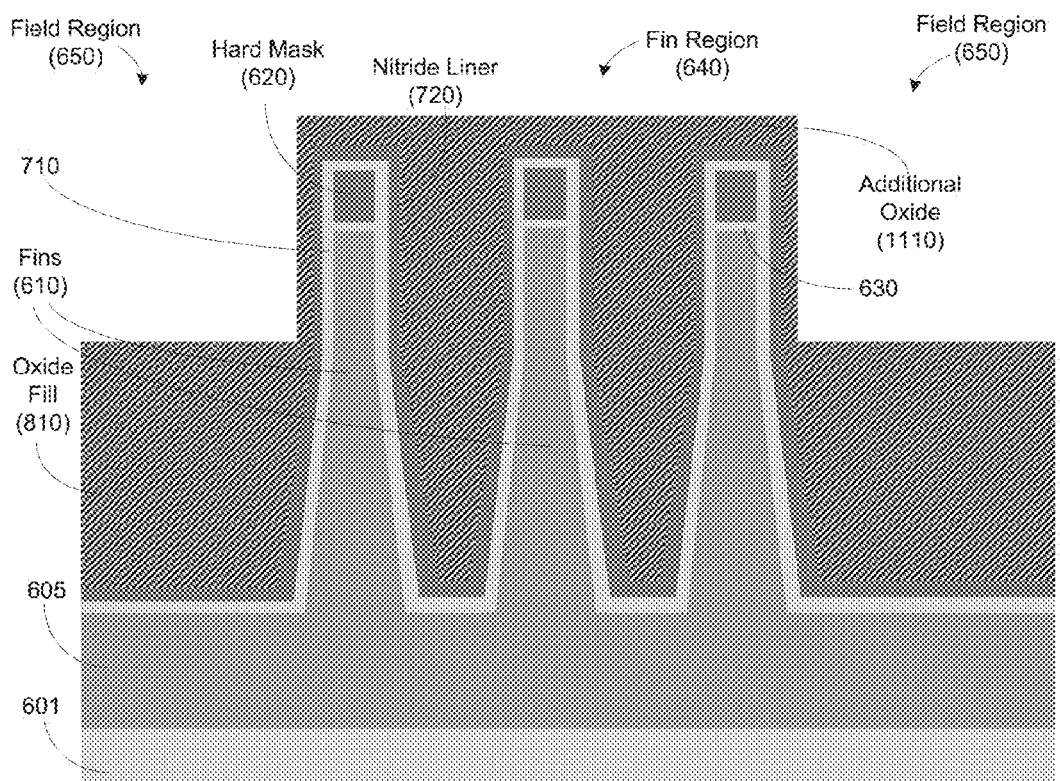
FIG. 11 illustrates a fifth stylized depiction of a cross-sectional view of further processing fins of a finFET device, in accordance with a embodiments herein.

An additional amount of liner material may be added to increase the thickness of the fill layer 810, above the fins 610, as shown in FIG. 11. This process results in the amount of oxide material in the fin region 640 and the field region 650 to increase slightly. In one embodiment, the thickness of the oxide fill material that is added is larger than about half of the fin space to pinch off the space between fins 610.

Figure 12:
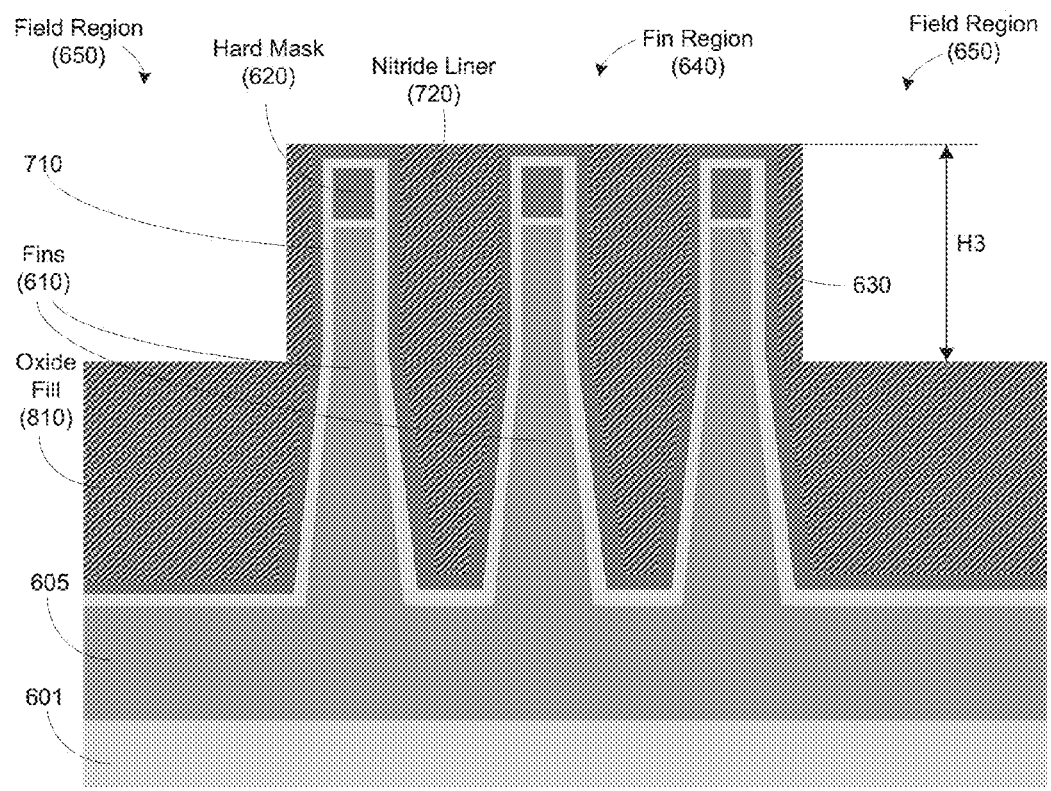
FIG. 12 illustrates a sixth stylized depiction of a cross-sectional view of further processing fins of a finFET device, in accordance with a embodiments herein.

As shown in FIG. 12, an oxide recess process is performed. In one embodiment, a liner etch-back process is performed. This recess process causes the oxide fill layer 810 to recede in the fin region 640. In one embodiment, the height of the oxide layer 810 above the fin region 640 is at the height of the fin assembly. The oxide material 810 is recessed to the top of the fins 610, just above the nitride liner 720. At this point of the process, the level of the oxide in both the field region 640 and the fin region 630 is at predetermined height differential, H3. The height differential H3 may be representative of the active channel fin height. In some embodiments, the height H2 may be approximately 30-40 nm.

Figure 13:
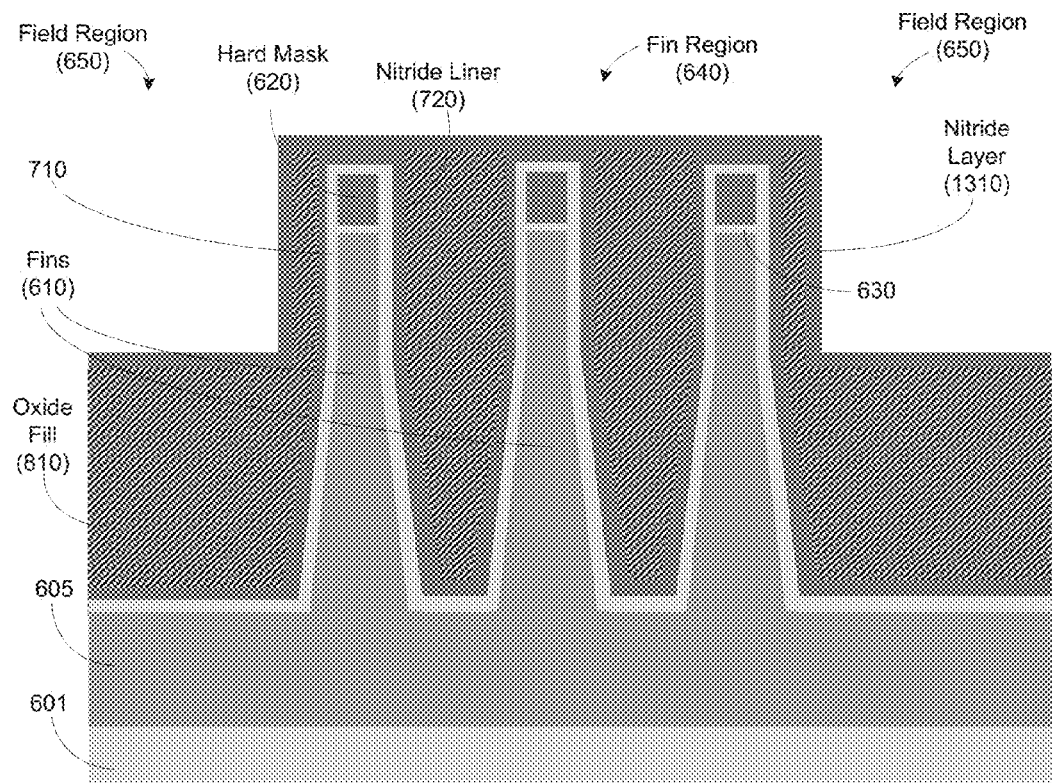
FIG. 13 illustrates a seventh stylized depiction of a cross-sectional view of further processing fins of a finFET device, in accordance with a embodiments herein.

As shown in FIG. 13, a second nitride layer 1310 is added above the fin region 640 and the field regions. The second nitride layer 1310 may be comprised of silicon nitride, (SiN, e.g., $Si_3N_4$). The second nitride layer 1310 is deposited such that it encompasses the fin region 640 (including the fins 610), the side portions of the fin region 640, as well as the field regions 650. In one embodiment, the thickness of the second nitride layer 1310 is relatively small so that the second nitride layer 1310 is a liner layer.

Figure 14:
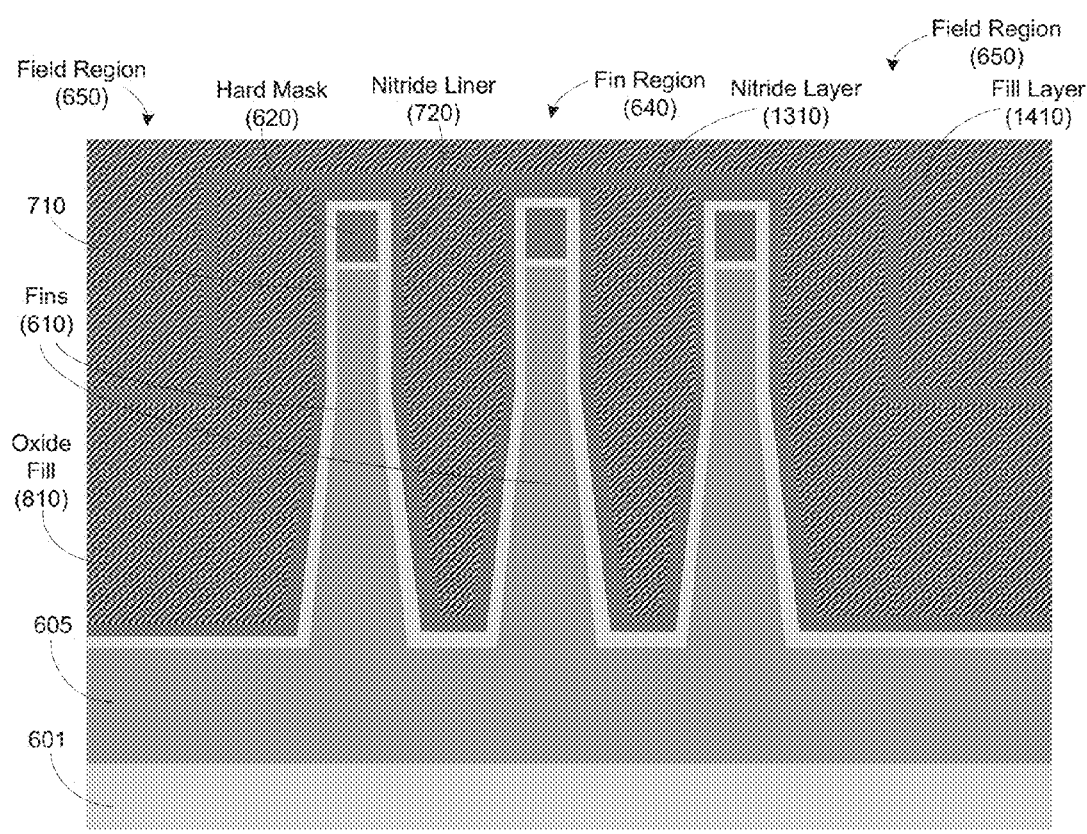
FIG. 14 illustrates an eighth stylized depiction of a cross-sectional view of further processing fins of a finFET device, in accordance with a embodiments herein.

In one embodiment, as shown in FIG. 14, another oxide fill layer 1410 (e.g., $SiO_2$) is deposited onto the device 600. The fill layer 1410 may comprise the same material ($SiO_2$) as the oxide liner 710, separated by the nitride liner 720. The fill layer 1410 is deposited in such a manner that it encompasses the fin region 640 (including the fins 610), as well as the field regions 650.

Figure 15:
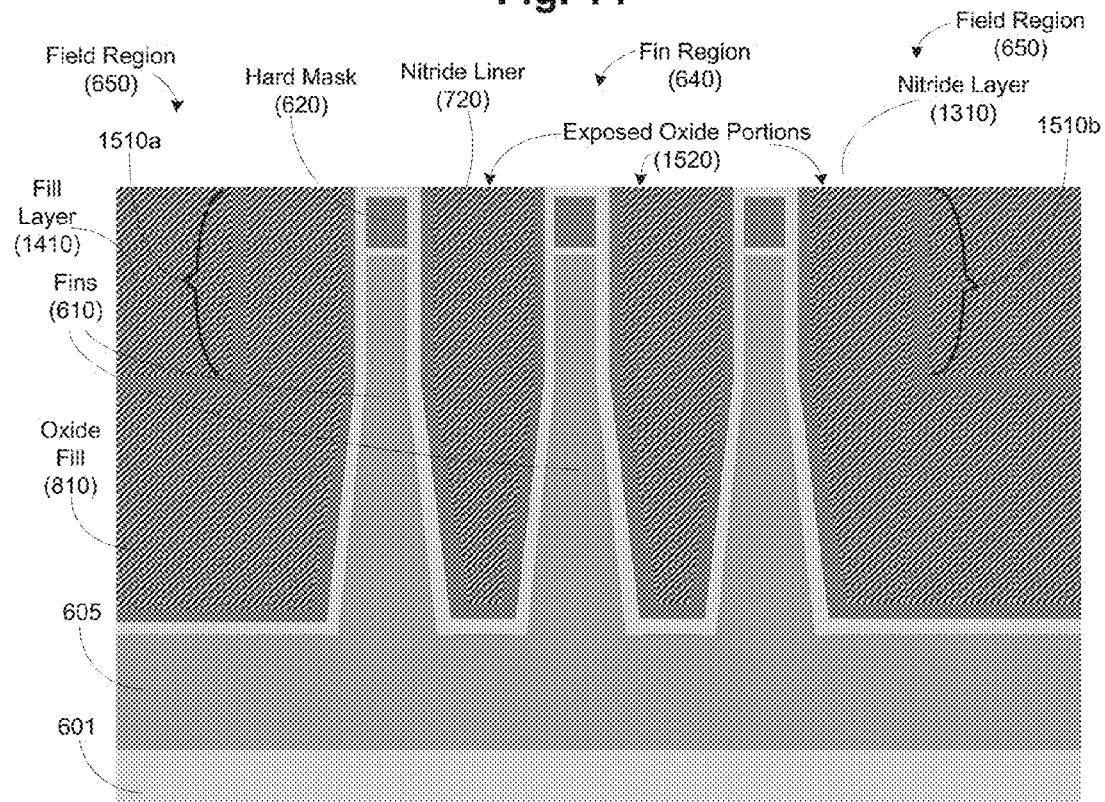
FIG. 15 illustrates a ninth stylized depiction of a cross-sectional view of further processing fins of a finFET device, in accordance with a embodiments herein.

As shown in FIG. 15, a CMP process is performed to polish down the oxide fill layer 1410 down to the top of the fin assembly. Further, the same CMP process, or alternatively, an additional CMP process, is performed, polishing away the portion of the second nitride layer 1310 at the portion of the fin region 640 above the fins assembly.

After the CMP process(es), the portions of the second nitride layer 1310 at the field regions 650 remain. Further, a first nitride layer portion 1510a (i.e., first boundary portion) on the side of the fin region 640, and a second nitride layer portion 1510b (i.e., second boundary portion) on the other side of the fin region 640 remain after the CMP process(es). In this manner, small portions of oxide layer 710 in the dense fin region 640 is exposed (i.e., exposed oxide portions 1520).

Figure 16:
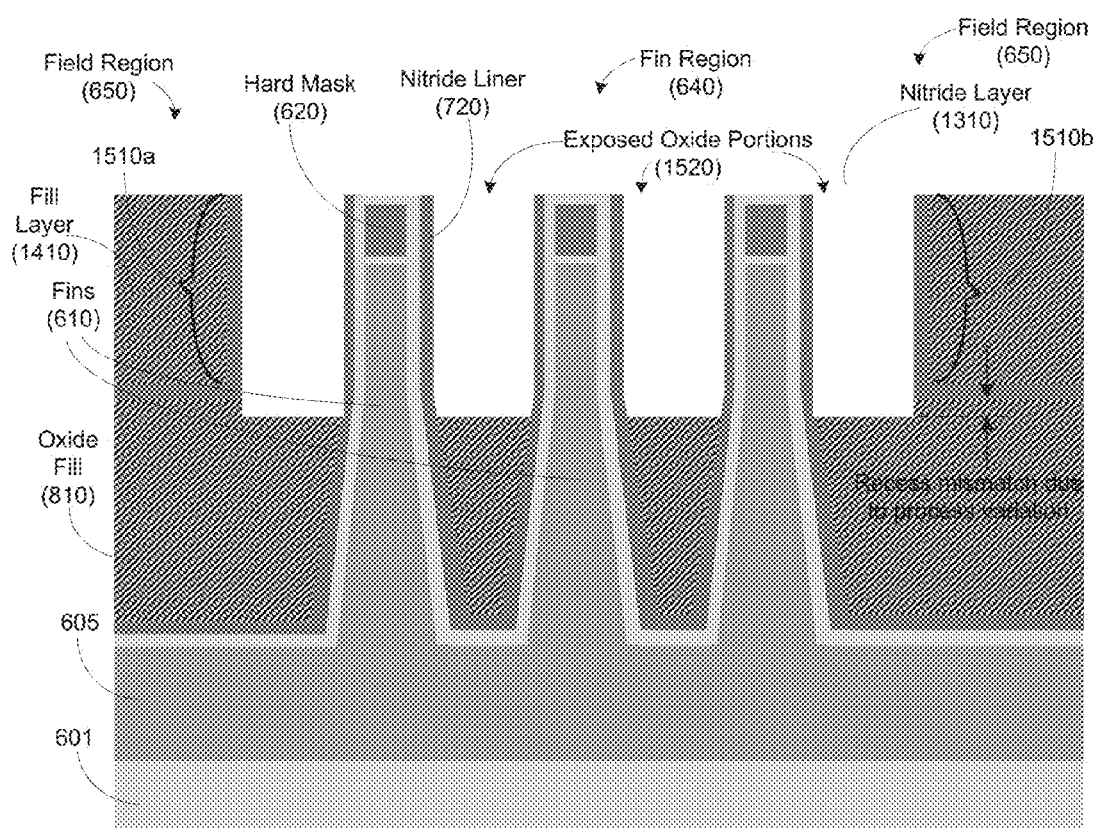
FIG. 16 illustrates a tenth stylized depiction of a cross-sectional view of further processing fins of a finFET device, in accordance with a embodiments herein.

As shown in FIG. 16, an oxide recess process is performed in the fin area 640. This oxide recess process (e.g., an etch process) is performed in between the first nitride layer portion 1520 at the boundary of the fin region 640, and the second nitride layer portion 1510b, within the fin area 640. This oxide recess process is performed at a predetermined rate and a predetermined time period to remove the exposed oxide material in the fin region 640 to a depth that is within a predetermined height of the level of the oxide layer 810 in the field regions 650. The target of the oxide recess process is to match the oxide height of the fin region 640 with the oxide height of the field regions 650. However, due to process variations, the recess rate may vary, thereby making is very difficult to match the height perfectly. Accordingly, a small amount of oxide recess height mismatch between the fin region 640 and the field regions 650 may take place. The oxide recess process of FIG. 16 causes a plurality recessed oxide cavities 1610 on the sides of the fins 610. Further, the thin oxide liners 630 above each of the fins 610 are also removed as a result of the CMP process(es) of FIG. 16.

Figure 17:
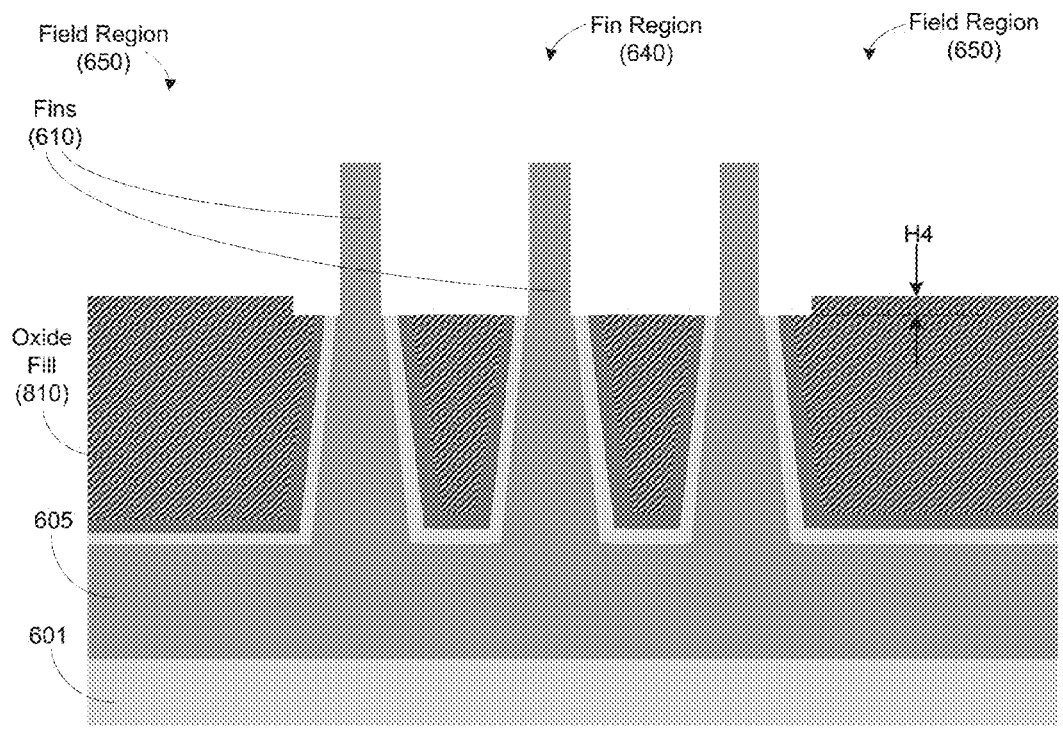
FIG. 17 illustrates an eleventh stylized depiction of a cross-sectional view of further processing fins of a finFET device, in accordance with a embodiments herein.

As shown in FIG. 17, a material removal process is performed to produce fins 610 that comprise an oxide layer that is within a predetermined height of the oxide layer in the surrounding field regions. This process is capable of removing the nitride hard mask layers 620 above the fins 620, the nitride liners 720 surrounding the fins 610, as well as the thin layers of oxide below the nitride hard masks 620.

In one embodiment, the material removal process of FIG. 17 may comprise two steps: a wet etching process to strip nitride material; and a wet etch process to remove the thin layer of silicon oxide. For example, in order to remove the nitride hard mask layers 620 above the fins 620 and the nitride liners 720 surrounding the fins 610, a hot phosphoric acid ($H_3PO_4$) etching process may be performed. Subsequently, a second etch process for removing the thin oxide layer of $SiO_2$. Since the thin oxide layer 710 is relatively very thin, i.e., less than about 3 nm, the change to the active height is minimal. As a result of these processes, an array of fins 620, which comprises an oxide layer that is within a predetermined height of the oxide layer in the surrounding field regions, is provided. A small step of a predetermined height, H4 (e.g., between about 2 nm to about 10 nm), exists between the height of the oxide layer in the field region 650 and the oxide layer in the fin region 640.

Additional processes known to those skilled in the art having benefit of the present disclosure may be performed to complete manufacturing integrated circuit comprising finFET devices. Embodiments described herein may be applied to gate fins, source fins, and/or drain fins.

Figure 18:
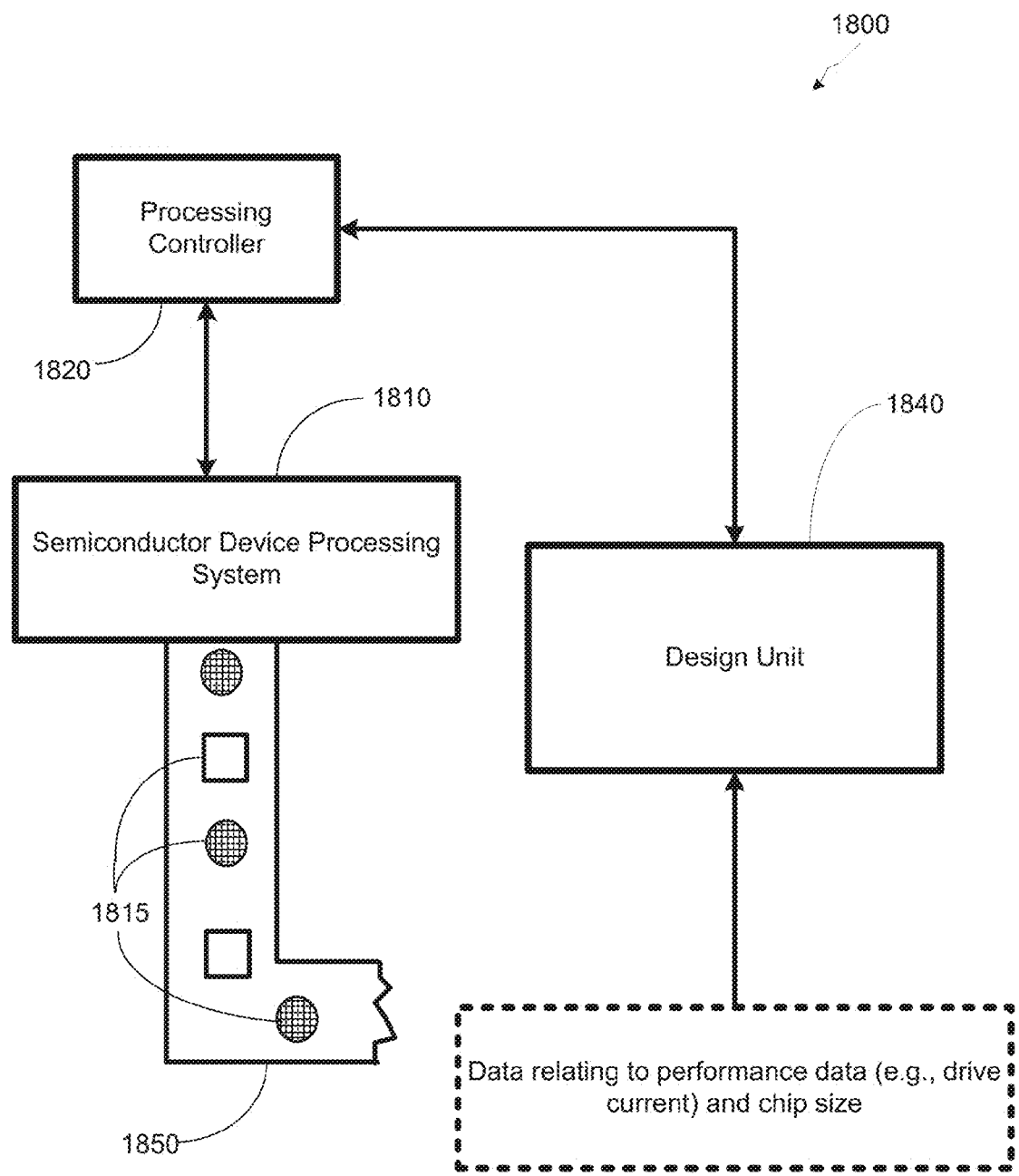
FIG. 18 illustrates a stylized depiction of a system for fabricating a semiconductor device package comprising finFET devices, in accordance with embodiments herein.

Turning now to FIG. 18, a stylized depiction of a system for fabricating a semiconductor device package comprising a topside interconnection substrate, in accordance with embodiments herein, is illustrated. The system 1800 of FIG. 18 may comprise a semiconductor device processing system 1810 and a design unit 1840. The semiconductor device processing system 1810 may manufacture integrated circuit devices based upon one or more designs provided by the design unit 1840.

The semiconductor device processing system 1810 may comprise various processing stations, such as etch process stations, photolithography process stations, CMP process stations, etc. One or more of the processing steps performed by the processing system 1810 may be controlled by the processing controller 1820. The processing controller 1820 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1810 may produce integrated circuits on a medium, such as silicon wafers. More particularly, the semiconductor device processing system 1810 produce integrated circuits having finFET devices that comprise fins that have channel voids filled with oxide and performed in a manner to reduce or substantially prevent oxidization, as described above.

The production of integrated circuits by the device processing system 1810 may be based upon the circuit designs provided by the integrated circuits design unit 1840. The processing system 1810 may provide processed integrated circuits/devices 1815 on a transport mechanism 1850, such as a conveyor system. In some embodiments, the conveyor system may be sophisticated clean room transport systems that are capable of transporting semiconductor wafers. In one embodiment, the semiconductor device processing system 1810 may comprise a plurality of processing steps, e.g., the $1^{st}$ process step, the $2^{nd}$ process set, etc., as described above.

In some embodiments, the items labeled "1815" may represent individual wafers, and in other embodiments, the items 1815 may represent a group of semiconductor wafers, e.g., a "lot" of semiconductor wafers. The integrated circuit or device 1815 may be a transistor, a capacitor, a resistor, a memory cell, a processor, and/or the like.

The integrated circuit design unit 1840 of the system 1800 is capable of providing a circuit design that may be manufactured by the semiconductor processing system 1810. The integrated circuit design unit 1840 may be capable of determining the number of devices (e.g., processors, memory devices, etc.) to place in a device package. The integrated circuit design unit 1840 may also determine the height of the fins, the size of the fin channels, etc. These dimensions may be based upon data relating to drive currents/performance metrics, device dimensions, etc. Based upon such details of the devices, the integrated circuit design unit 1840 may determine specifications of the finFETs that are to be manufactured. Based upon these specifications, the integrated circuit design unit 1840 may provide data for manufacturing a semiconductor device package described herein. The system 1800 is capable of performing the steps described in FIGS. 6-17.

The system 1800 may be capable of performing analysis and manufacturing of various products involving various technologies. For example, the system 1800 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
depositing an oxide liner around a plurality of fins in a fin array region in a finFET device;
depositing a first nitride liner around said fins above said oxide liner;
performing a first oxide process for controlling a first oxide recess level in a field region adjacent to said fin array region, wherein said first oxide process comprises depositing an oxide layer over said field region and said fin array region and performing an oxide recess process to bring said oxide layer to a first oxide recess level in said field region; and
performing a second oxide process for controlling a second oxide recess level in said fin array region, wherein said second oxide process comprises isolating said fin array region, depositing oxide material, and performing an oxide recess process to bring the oxide level in said fin array region to a second oxide recess level, wherein said first oxide recess level is within a predetermined height differential of said second oxide recess level.

2. The method of claim 1, further comprising:
depositing a thin oxide layer over a base layer for forming said thin oxide layer above each of said fins; and
depositing a hard mask layer above said thin oxide layer.

3. The method of claim 2, wherein first oxide process for controlling a first oxide recess level in a field region comprises:
performing a first polishing process for polishing down said first oxide layer and exposing said first nitride liner; and
performing a first oxide recess process to reduce said oxide layer in said field region to said first oxide level.

4. The method of claim 1, wherein performing said second oxide process for controlling a second oxide recess level in said fin array region comprises:
depositing an oxide liner on said fin array region and said field region;
performing a liner oxide etch back process for reducing the thickness of said oxide liner above said fins to the level of said nitride liner and exposing said nitride liner;
depositing a second nitride liner on said fin array region and said field region;
depositing an oxide material over said second nitride liner;
performing an second polishing process for polishing the oxide material and said nitride liner down to the level of said nitride liner and exposing said hard mask and said portion of said second nitride liner forming nitride line boundaries around said fin array region; and
performing a second oxide recess process for removing the oxide material between said fins and said nitride line boundaries down to said second oxide recess level.

5. The method of claim 4, further comprising
performing a first etch process for removing first nitride liner above said second oxide recess level; and
performing a second etch process for removing said oxide liner above said second oxide recess level, exposing said fins above said second oxide recess level.

6. The method of claim 5, wherein performing a first etch process for removing first nitride liner above said second oxide recess level comprises performing a wet silicon oxide etching process.

7. The method of claim 5, wherein performing said second etch process for removing said oxide liner above said second oxide recess level, exposing said fins above said second oxide recess level comprises performing a hot phosphoric acid etching process.

8. The method of claim 4, wherein performing said first polishing process comprise performing a chemical-mechanical polishing process and wherein performing said second polishing process comprise performing a chemical-mechanical polishing process.

9. The method of claim 1, wherein performing said second oxide process for controlling a second oxide recess level to be within a predetermined height differential comprises performing said second oxide process to provide a height differential of between about 30 nm and about 40 nm.

10. A method, comprising:
forming a plurality of fins in a fin array region adjacent to a field region;
depositing a first oxide layer over said field region and said fin array region
performing a first oxide recess process to bring said oxide layer to a first oxide recess level in said field region resulting in a recess loading height differential between the level of oxide in said field region and a higher level of oxide in said fin array region;
depositing an oxide liner in said fin array region and said field region;

depositing a first nitride liner over said oxide liner on said fin array region and said field region;

depositing an oxide material over said first nitride liner;

performing a polishing process for polishing said oxide material and said first nitride liner down to the level of said first oxide layer, exposing a hard mask structure of each of said fins and exposing said portion of said first nitride liner forming nitride line boundaries around said fin array region; and performing a second oxide recess process for removing the oxide material between said fins and said nitride line boundaries down to an oxide recess level that is within a predetermined height differential of said level of oxide in said field region.

11. The method of claim 10, where providing a plurality of fins comprises:

forming a base layer over a substrate;

forming a plurality of fins over said base layer;

depositing a thin oxide layer above each of said fins;

depositing a hard mask layer above said thin oxide layer;

depositing an oxide liner around said fins;

depositing a thin nitride liner around said fins above said oxide liner;

wherein said hard mask structure comprises said hard mask layer, a portion of the thin oxide layer above said hard mask layer, and a portion of the thin nitride liner above the top portion of the hard mask layer.

12. The method of claim 11, wherein first oxide process for providing said oxide recess level in said field region comprises:

performing a polishing process for polishing down said oxide liner and exposing said nitride liner; and performing a first oxide recess process to reduce said oxide layer in said field region to said oxide level of said field region.

13. The method of claim 10, further comprising:

performing a first etch process for removing said first nitride liner; and performing a second etch process for removing said oxide liner above said fins, exposing said fins above said oxide recess level in said field region.

14. The method of claim 13, wherein performing said first etch process comprises process for removing first nitride liner above said second oxide recess level comprises performing a wet silicon oxide etching process.

15. The method of claim 13, wherein performing said second etch process for removing said oxide liner above said second oxide recess level, exposing said fins above said second oxide recess level comprises performing a hot phosphoric acid etching process.

* * * * *